(12) United States Patent
Alfandari et al.

(10) Patent No.: US 10,964,660 B1
(45) Date of Patent: Mar. 30, 2021

(54) USE OF ADHESIVE FILMS FOR 3D PICK AND PLACE ASSEMBLY OF ELECTRONIC COMPONENTS

(71) Applicant: Flex Ltd., Singapore (SG)

(72) Inventors: Yoav Alfandari, Even Yehuda (IL); Yitzchak Shpitzer, Haifa (IL)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 16/196,395

(22) Filed: Nov. 20, 2018

(51) Int. Cl.
*H01L 23/00* (2006.01)
*H01L 23/13* (2006.01)

(52) U.S. Cl.
CPC ............ *H01L 24/73* (2013.01); *H01L 23/13* (2013.01); *H01L 24/92* (2013.01); *H01L 2224/73104* (2013.01); *H01L 2224/73204* (2013.01); *H01L 2224/9211* (2013.01)

(58) Field of Classification Search
CPC ......... H01L 24/73; H01L 23/13; H01L 24/92; H01L 2224/73104; H01L 2224/73204; H01L 2224/9211
See application file for complete search history.

(56) References Cited

U.S. PATENT DOCUMENTS

| | | |
|---|---|---|
| 3,671,726 A | 6/1972 | Kerr |
| 4,809,425 A | 3/1989 | Monforte |
| 4,838,892 A | 6/1989 | Wyler |
| 4,855,537 A | 8/1989 | Nakai et al. |
| 5,323,051 A * | 6/1994 | Adams ............ H01L 23/04 257/417 |
| 5,479,138 A | 12/1995 | Kuroda et al. |
| 5,675,299 A | 10/1997 | Suski |

(Continued)

FOREIGN PATENT DOCUMENTS

| | | |
|---|---|---|
| CN | 108020164 A | 10/2016 |
| KR | 20090090701 A | 7/2009 |

OTHER PUBLICATIONS

Non-Final Office Action dated Feb. 4, 2020, U.S. Appl. No. 16/221,256, filed Dec. 14, 2018, Applicant: Cheng Yang, 18 pages.

(Continued)

*Primary Examiner* — Fernando L Toledo
*Assistant Examiner* — Neil R Prasad
(74) *Attorney, Agent, or Firm* — Haverstock&Owens LLP

(57) ABSTRACT

An electronic device assembly includes one or more discrete electronic components mounted onto a substrate having a 3D, 2.5D, or N×2D geometric classification. The substrate surface includes a specific mounting location to which an electronic component is to be electrically connected, where each specific mounting location includes one or more electrical connection points, such as contact pads. An anisotropic conductive film (ACF) is applied to the substrate surface covering the one or more electrical connection points of the specific mounting location, and the electronic component is placed on the ACF and properly aligned with the specific mounting location on the substrate surface. Pressure and heat are applied to compress the ACF to form an electrical interconnection between corresponding pairs of the electrical connection points on the electronic device and the specific mounting location on the substrate surface.

25 Claims, 4 Drawing Sheets

(56) References Cited

U.S. PATENT DOCUMENTS

| | | | |
|---|---|---|---|
| 6,518,677 B1* | 2/2003 | Capote | B23K 35/025 257/778 |
| 7,091,619 B2* | 8/2006 | Aoyagi | H01L 23/49816 257/777 |
| 7,504,904 B1 | 3/2009 | Powers et al. | |
| 7,687,899 B1 | 3/2010 | Berry | |
| 7,872,343 B1 | 1/2011 | Berry | |
| 8,034,447 B2* | 10/2011 | Sakai | H01L 24/81 428/356 |
| 8,283,767 B1 | 10/2012 | Berry | |
| 8,409,917 B2 | 4/2013 | Yoon | |
| 8,450,848 B2* | 5/2013 | Sakurai | H01L 21/563 257/737 |
| 8,497,579 B1* | 7/2013 | Shih | H01L 21/50 257/737 |
| 8,546,954 B2* | 10/2013 | Kwon | H01L 25/105 257/777 |
| 8,587,385 B2 | 11/2013 | Umeda | |
| 8,728,865 B2* | 5/2014 | Haba | G01R 31/2886 438/109 |
| 8,928,865 B2* | 1/2015 | Rakuljic | G01S 17/325 356/3.01 |
| 8,941,225 B2 | 1/2015 | Choi | |
| 8,970,051 B2* | 3/2015 | Shi | H01L 24/06 257/777 |
| 10,121,722 B1 | 11/2018 | Jha | |
| 10,186,480 B2 | 1/2019 | Muthukumar | |
| 2001/0055069 A1 | 12/2001 | Hudson | |
| 2002/0056906 A1* | 5/2002 | Kajiwara | H01L 24/11 257/697 |
| 2003/0116010 A1 | 6/2003 | Duquette | |
| 2004/0224441 A1* | 11/2004 | Saito | H01L 24/11 438/119 |
| 2005/0039945 A1* | 2/2005 | Matsuda | H01L 23/4985 174/254 |
| 2009/0029504 A1* | 1/2009 | Paik | H01L 21/563 438/108 |
| 2009/0140415 A1 | 6/2009 | Furuta | |
| 2009/0166835 A1 | 7/2009 | Yang | |
| 2009/0243072 A1 | 10/2009 | Ha | |
| 2010/0148356 A1 | 6/2010 | Tamaki | |
| 2011/0031598 A1 | 2/2011 | Lee | |
| 2012/0119404 A1 | 5/2012 | Wallace | |
| 2013/0069239 A1 | 3/2013 | Kim | |
| 2013/0214396 A1 | 8/2013 | Kim | |
| 2014/0312481 A1 | 10/2014 | Choi | |
| 2015/0001731 A1 | 1/2015 | Shuto | |
| 2015/0084170 A1 | 3/2015 | Im | |
| 2015/0287672 A1 | 10/2015 | Yazdani | |
| 2016/0043047 A1 | 2/2016 | Shim | |
| 2016/0329272 A1 | 11/2016 | Geissler | |
| 2017/0047308 A1 | 2/2017 | Ho | |
| 2017/0141080 A1 | 5/2017 | Chen | |
| 2017/0170799 A1 | 6/2017 | Kong et al. | |
| 2017/0250170 A1 | 8/2017 | Yu | |
| 2018/0090471 A1 | 3/2018 | Chiu | |
| 2018/0164921 A1 | 6/2018 | Leigh | |
| 2018/0269181 A1 | 9/2018 | Yang | |
| 2018/0277485 A1 | 9/2018 | Han | |
| 2018/0315740 A1 | 11/2018 | Im | |
| 2018/0366412 A1 | 12/2018 | Hsieh | |
| 2019/0019758 A1 | 1/2019 | Kim | |
| 2019/0029136 A1 | 1/2019 | Bharadwaj | |
| 2019/0051615 A1 | 2/2019 | Nair | |
| 2019/0067207 A1 | 2/2019 | Hu | |
| 2019/0067255 A1 | 2/2019 | Kim | |
| 2019/0074267 A1 | 3/2019 | Yang | |
| 2019/0099729 A1 | 4/2019 | Go et al. | |
| 2019/0103364 A1 | 4/2019 | Kim | |
| 2019/0181097 A1 | 6/2019 | Cheah | |
| 2019/0229046 A1 | 7/2019 | Tsai | |
| 2019/0295937 A1 | 9/2019 | Zhang | |
| 2019/0378795 A1 | 12/2019 | Lee | |
| 2019/0385977 A1 | 12/2019 | Elsherbini | |
| 2020/0043299 A1 | 2/2020 | Mabille | |
| 2020/0105719 A1 | 4/2020 | Li | |
| 2020/0108768 A1 | 4/2020 | Ali | |
| 2020/0194330 A1 | 6/2020 | Ramanathan | |
| 2020/0029492 A1 | 9/2020 | Bhagavat | |

OTHER PUBLICATIONS

Non-Final Office Action, dated May 20, 2020, U.S. Appl. No. 16/221,256, filed Dec. 14, 2018, applicant: Cheng Yang, 18 pages.

\* cited by examiner

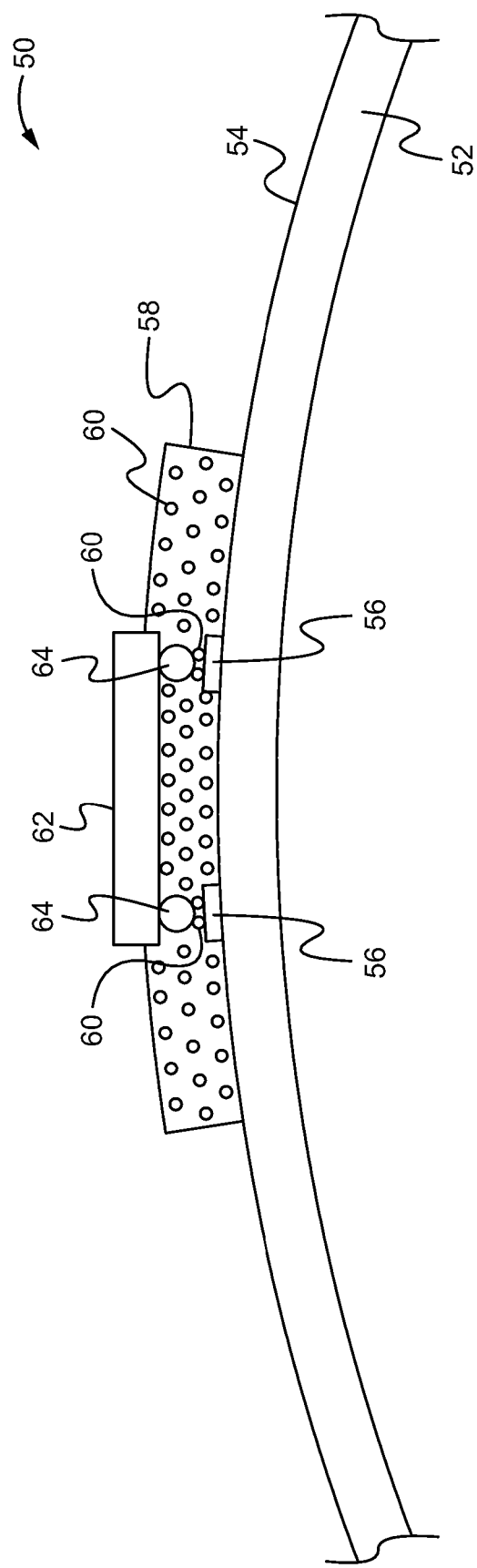
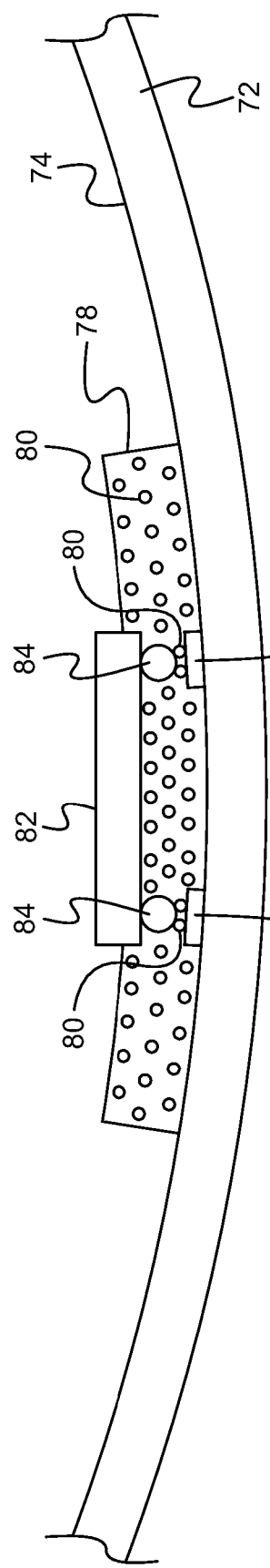
Fig. 8
Fig. 9

USE OF ADHESIVE FILMS FOR 3D PICK AND PLACE ASSEMBLY OF ELECTRONIC COMPONENTS

FIELD OF THE INVENTION

The present invention is generally directed to the field of electronic device manufacturing, or structural electronics. More specifically, the present invention is directed to systems and methods of using adhesive films for 3D (three-dimensional) pick and place assembly of electronic components.

BACKGROUND OF THE INVENTION

Electronic components, such as surface mount devices, can be mounted to a substrate surface using a pick and place process. An individual component is picked up and placed onto a specific mounting location on the substrate, such as a location coincident with one or more contact pads. Solder paste or electrically conductive adhesive (ECA) is applied onto the mounting location prior to the component being placed on the substrate. The solder paste or ECA is then cured to secure the mounted component in position. A pick and place process refers to the placement of a component onto a substrate. The substrate, and corresponding substrate surface onto which the component is placed, can have a 2D, 2.5D, N×2D, or 3D geometric classification. A 2D (two-dimensional) classification refers to the substrate having a planar surface, and the electronic component is placed on the planar surface. FIG. 1 illustrates a cross-sectional view of a 2D geometric classification where components 2 are positioned on a planar surface 4. In the 2D geometric classification, the opposing surface 6 is also a planar surface. A 2.5D classification includes substrates with various different configurations; however, in each configuration there is a planar surface portion onto which the components are mounted. FIG. 2 illustrates a cross-sectional view of a first 2.5D geometric classification where components 2 are positioned on a planar surface 8. In the first 2.5D classification, the opposing surface 10 is planar with interspersed protrusions 12. FIG. 3 illustrates a cross-sectional view of a second 2.5D geometric classification where components 2 are positioned on a planar surface portions 14, interspersed between protrusions 16. In the second 2.5D classification, the opposing surface 18 is a planar surface. FIG. 4 illustrates a cross-sectional view of a third 2.5D geometric classification where components 2 are positioned on multiple different planar surfaces 20 and 22. The planar surfaces 20 and 22 are parallel to each other an interconnected vi angled planar surface 21. A N×2D classification refers to the substrate having multiple different planar surfaces onto which components are placed, where the planar surfaces are non-parallel, or angled, to each other. FIG. 5 illustrates a cross-sectional view of a N×2D geometric classification where components 2 are positioned on multiple different planar surfaces 24, 26, and 28. The planar surfaces 24, 26, and 28 are angled to each other. A 3D classification refers to a surface at least a portion of which is non-planar. Portions of the surface onto which electronic components are attached are planar. In other words, each planar surface portion has a surface area and shape that matches a required footprint of the mounted electronic component. The 3D classification indicates that the remaining portion of the substrate surface, that portion not used for mounting electronic components, has at least a non-planar portion. FIG. 6 illustrates a cross-sectional view of a first 3D geometric classification where each component 2 is positioned on a planar portion of a regular non-planar surface 30. Examples of regular non-planar surfaces include cylindrical surfaces or domed surfaces. FIG. 7 illustrates a cross-sectional view of a second 3D geometric classification where each component 2 is positioned on a planar portion of a freeform, non-planar surface 32.

2D pick and place refers to the placement of a component onto a surface having a 2D geometric classification. 3D pick and place refers to the placement of a component onto a surface having a 3D geometric classification. Mounting multiple components using 2D pick and place is a straight-forward process since the planar surface to which the components are added remains horizontal while all components are mounted. As each component is subsequently mounted to the planar surface, previously mounted components can be secured in position by curing the corresponding solder or adhesive. There are two 3D pick and place methods for placing the components. In a first method, a robotic arm holds the component and can place it on a non-horizontal planar surface of the substrate. If required, another robotic arm can be added to manipulate the substrate and corresponding non-horizontal planar surface on which the component is placed. In a second method, a robotic arm only manipulates the substrate and corresponding planar surface onto which the component is to be placed such that the planar surface is placed in a horizontal position. A gripper, which holds the component, places the component vertically on the horizontal planar surface. In both methods, the placed component is in a non-horizontal position, either at the time of placement (method 1) or after placement (method 2) such as when the substrate is manipulated to have another planar surface placed in a horizontal position for mounting of another component. Either situation can cause the component to fall off or shift from its initial placement position. As such, a curing step must be performed either while holding the component on a non-horizontal surface, as in the first method, or prior to rotating the substrate, as in the second method, so that the solder paste or ECA corresponding to the component cures, thereby securing the component is position. After curing, the substrate can then be rotated to mount another component. Although effective, proper placement of the solder paste or ECA, which is applied as droplets, is often problematic. Additionally, some applications have a fine pitch between adjacently positioned contact pads on the 3D substrate surface. Applications of solder paste or ECA drops on contact pads having such fine pitch is often difficult to achieve without the adjacent drops touching each other, which creates a short-circuit between adjacent contact pads. An on-going challenge for adding components to a 3D body is how to secure the components in proper position, especially during rotation of the 3D body to add subsequent components.

SUMMARY OF THE INVENTION

An electronic device assembly includes one or more discrete electronic components mounted onto a substrate having a 3D, 2.5D, or N×2D geometric classification. The substrate surface includes a specific mounting location to which an electronic component is to be electrically connected, where each specific mounting location includes one or more electrical connection points, such as contact pads. In some embodiments, an anisotropic conductive film (ACF) is applied to the substrate surface covering the one or more electrical connection points of the specific mounting location, and the electronic component is placed on the ACF and properly aligned with the specific mounting location on the substrate surface. The ACF also functions to mechanically secure the electronic component in place. Pressure and heat are applied to compress the ACF to form an electrical interconnection between corresponding pairs of the electrical connection points on the electronic component and the specific mounting location on the substrate surface. In other embodiments, an isotropic conductive film (ICF) can be used in place of ACF to electronically connect electronic components with large contact pads when short circuiting between the pads is not an issue. In still other embodiments, non-conducting film (NCF) can be used to attach electronic components without achieving an electrical connection. This can be relevant for electronic components that are connected to the circuit not thru pads, for example wire bonding or conductive ink printing, or for mechanical components that need to be placed on the surface without an electric connection.

In an aspect, an electronic device assembly is disclosed. The electronic device assembly includes a substrate, an adhesive film, and an electronic component. The substrate has a substrate surface and one or more first electrical connection points on the substrate surface, wherein the substrate surface is a 3D surface, a 2.5D surface, or a N×2D surface. The adhesive film has a first surface and a second surface opposing the first surface, wherein the first surface of the adhesive film is coupled to the substrate surface of the substrate and covers the one or more first electrical connections points. The electronic component has one or more second electrical connection points, wherein the electronic component is pressed onto the second surface of the adhesive film and aligned with the substrate such that each of the one or more second electrical connection points of the electronic component is aligned with a corresponding one of the one or more first electrical connection points on the substrate surface. In some embodiments, the substrate comprises a thermoplastic layer. In some embodiments, each of the one or more first electrical connection points are contact pads. In some embodiments, the electronic component is a flip-chip semiconductor device, and the one or more electrical connection points are contact bumps. In some embodiments, the substrate is a three-dimensional in-mold electronic (3D-IME) device. In some embodiments, the substrate is a three-dimensional molded interconnect device (3D-MID). In some embodiments, the adhesive film is an anisotropic conductive film or an anisotropic conductive paste. In some embodiments, each of the one or more first electrical connection points is electrically connected to the corresponding one of the one or more first electrical connection points via the anisotropic conductive film or the anisotropic conductive paste. In some embodiments, the substrate surface is a regular non-planar surface. In some embodiments, the substrate surface is a freeform, non-planar surface.

In another aspect, a method of making an electronic device assembly is disclosed. The method includes forming a substrate having a substrate surface and one or more first electrical connection points on the three-dimensional surface, wherein the substrate surface is a 3D surface, a 2.5D surface, or a N×2D surface; applying an adhesive film to the substrate surface, wherein the adhesive film covers the one or more first electrical connections points; placing an electronic component onto the adhesive film, wherein the electronic component has one or more second electrical connection points, further wherein the electronic component is aligned with the substrate such that each of the one or more second electrical connection points of the electronic component is aligned with a corresponding one of the one or more first electrical connection points on the substrate surface; and applying heat and pressure to compress the electronic component and the substrate surface toward each other. In some embodiments, placing the electronic component comprises using a three-dimensional pick and place process. In some embodiments, forming the substrate comprises forming a three-dimensional body. In some embodiments, the three-dimensional body is a three-dimensional in-mold electronic (3D-IME) device. In some embodiments, the substrate is a three-dimensional molded interconnect device (3D-MID). In some embodiments, the electronic component is a flip-chip semiconductor device, and the one or more electrical connection points are contact bumps, and placing the electronic component on the adhesive film comprises placing the contact bumps on the adhesive film. In some embodiments, each of the one or more first electrical connection points are contact pads. In some embodiments, forming the substrate having the substrate surface comprises forming the substrate surface as a regular non-planar surface. In some embodiments, forming the substrate having the substrate surface comprises forming the substrate surface as a freeform, non-planar surface. In some embodiments, the method also includes molding an overmold over the electronic component. In some embodiments, the adhesive film is an anisotropic conductive film or an anisotropic conductive paste. In some embodiments, applying heat and pressure to compress the electronic component and the substrate surface toward each other forms an electrical connection between each of the one or more second electrical connection points and corresponding one of the one or more first electrical connection points via the anisotropic conductive film or the anisotropic conductive paste. In some embodiments, the method also includes applying heat to the adhesive film before placing the electronic component.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 8 illustrates a cross-sectional view of an electronic device assembly according to some embodiments.

FIG. 9 illustrates an electronic device assembly according to some other embodiments.

DETAILED DESCRIPTION OF THE EMBODIMENTS

Figure 1:
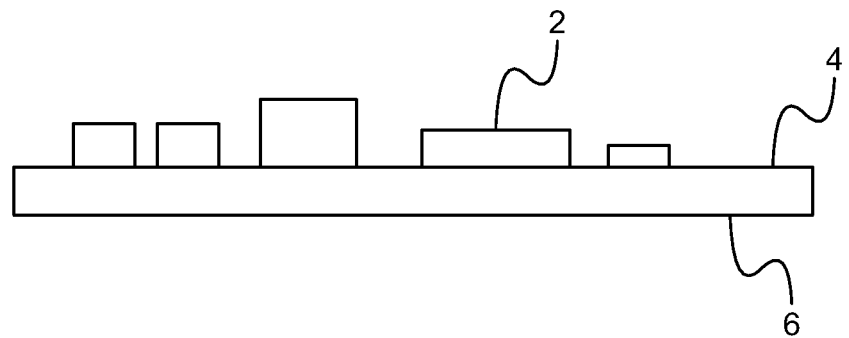
FIG. 1 illustrates a cross-sectional view of a 2D geometric classification where components are positioned on a planar surface.
Figure 2:
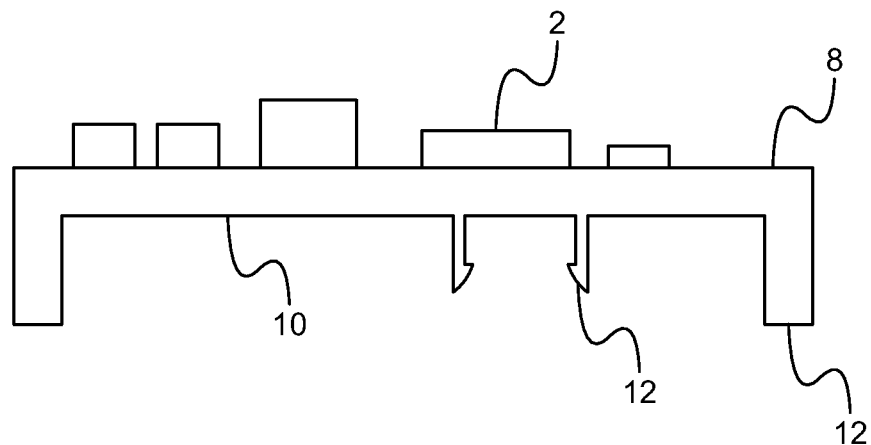
FIG. 2 illustrates a cross-sectional view of a first 2.5D geometric classification where components are positioned on a planar surface.
Figure 3:
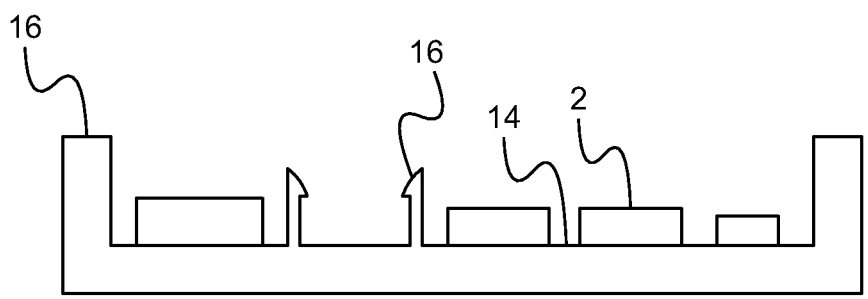
FIG. 3 illustrates a cross-sectional view of a second 2.5D geometric classification where components are positioned on a planar surface portions, interspersed between protrusions.
Figure 4:
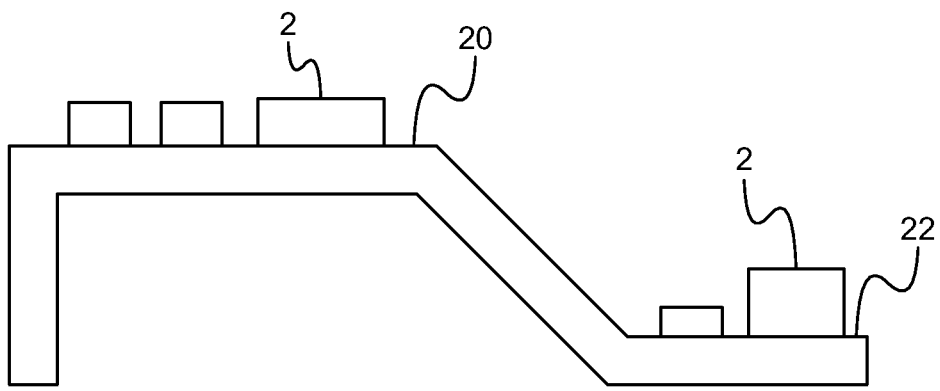
FIG. 4 illustrates a cross-sectional view of a third 2.5D geometric classification where components are positioned on multiple different planar surfaces.
Figure 5:
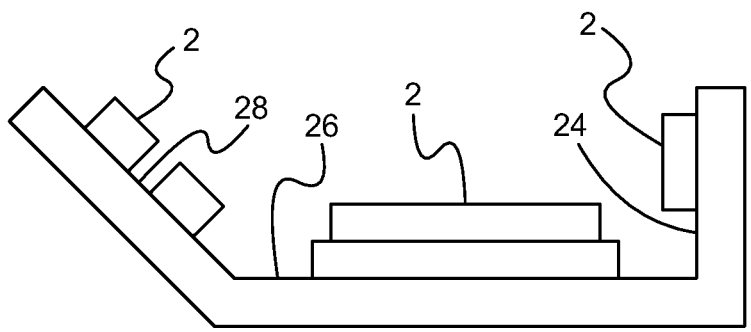
FIG. 5 illustrates a cross-sectional view of a N×2D geometric classification where components 2 are positioned on multiple different planar surfaces.
Figure 6:
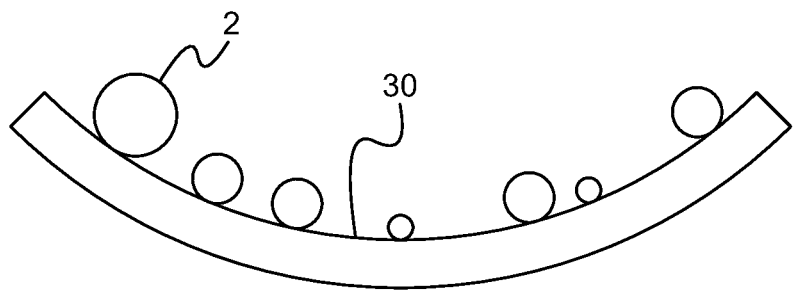
FIG. 6 illustrates a cross-sectional view of a first 3D geometric classification where components are positioned on regular non-planar surface.
Figure 7:
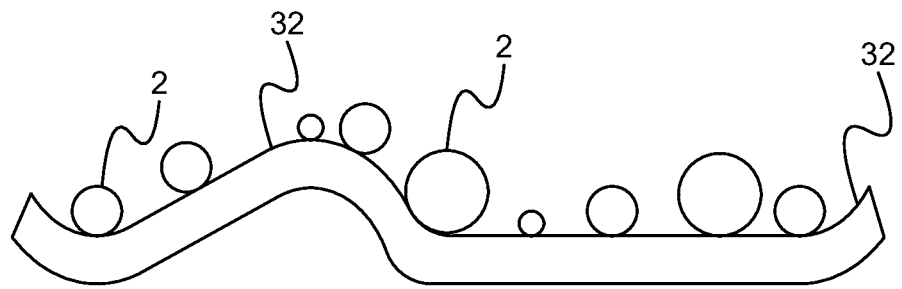
FIG. 7 illustrates a cross-sectional view of a second 3D geometric classification where components are positioned on freeform, non-planar surface.

Embodiments of the present application are directed to an electronic device assembly and method of manufacturing the electronic device assembly. Those of ordinary skill in the art will realize that the following detailed description of the electronic device assembly and method of manufacturing the electronic device assembly is illustrative only and is not intended to be in any way limiting. Other embodiments of the electronic device assembly and method of manufacturing the electronic device assembly will readily suggest themselves to such skilled persons having the benefit of this disclosure.

Reference will now be made in detail to implementations of the electronic device assembly and method of manufacturing the electronic device assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments are directed to an electronic device assembly, and method of manufacturing the electronic device assembly, where the electronic device assembly includes one or more discrete electronic components mounted onto a substrate having a 3D geometric classification. The substrate 3D surface includes a specific mounting location to which an electronic component is to be electrically connected, where each specific mounting location includes one or more electrical connection points, such as contact pads. In some embodiments, an anisotropic conductive film (ACF) is applied to the substrate 3D surface covering the one or more electrical connection points of the specific mounting location, and the electronic component is placed on the ACF and properly aligned with the specific mounting location on the substrate 3D surface. The ACF also functions to mechanically secure the electronic component in place before curing the ACF. Pressure and heat are applied to compress the ACF to form an electrical interconnection between corresponding pairs of the electrical connection points on the electronic component and the specific mounting location on the substrate 3D surface. In other embodiments, an isotropic conductive film (ICF) can be used in place of ACF to electronically connect components with large contact pads when short circuiting between the pads is not an issue. In still other embodiments, non-conducting film (NCF) can be used to attach electronic components without achieving an electrical connection. This can be relevant for electronic components that are connected to the circuit not thru pads, for example wire bonding or conductive ink printing, or for mechanical components that need to be placed on the surface without an electric connection. Subsequent description is directed to an electronic device assembly that includes an ACF. It is understood that such description can alternatively be applied to an ICF in those applications where short circuiting between contact pads is no an issue, or to an NCF in those applications where no external connection is required between the electronic component and underlying contact pads. In general, an adhesive film is used to mount an electronic component to a substrate 3D surface.

In some embodiments, the substrate is a 3D Molded Interconnect Device (3D-MID). MID utilizes the capabilities of flexible and printed electronics and injection molding. A substrate having a desired shape is typically formed by injection molding. In the case of 3D-MID, the formed substrate can have a 3D geometric classification. Conductive ink is printed onto a 3D surface of the 3D substrate to form conductive traces, or interconnects. The circuit remains functional as the conductive interconnects contour the substrate 3D surface. The conductive interconnects include the one or more electrical connection points that form the specific mounting location on the substrate 3D surface. The substrate 3D surface can include multiple different specific mounting locations and corresponding conductive interconnects.

In other embodiments, the substrate is a 3D In-Mold Electronics (3D-IME), or structural electronics, device that utilizes the capabilities of flexible and printed electronics, thermoforming and injection molding. In contrast to MID, an IME device includes stretchable conductive ink that is screen printed onto a thermoformable plastic sheet to form conductive interconnects prior to the thermoforming process. Thermoforming is a manufacturing process where a plastic sheet is heated to a sufficient temperature that permits the heated sheet to be stretched into or onto a mold and cooled to a finished shape. The circuit remains functional as the conductive interconnects contour the substrate 3D shape formed during the thermoforming process.

After the 3D-shaped substrate is formed, an anisotropic conductive layer is applied over the substrate surface area that includes the specific mounting location. An anisotropic conductive layer is made of anisotropic conductive particles mixed within an adhesive material, the combination of which is referred to as an anisotropic conductive film (ACF) or an anisotropic conductive paste (ACP). As used herein, an ACF and an ACP are collectively referred to simply as ACF. The conductive particles can be nano-particles or micro-particles made of a conductive material, such as a metal or metal alloy. Examples of such conductive particles include, but are not limited to, nickle-copper particles or gold plated copper particles. The exact material of the conductive particles is application specific. The conductive particles have a thin outer insulating layer, and are normally not touching each other, so the film functions as an electrical insulator. The ACF can be made into various sizes. In the case of multiple different specific mounting locations a single continuous ACF can be used to cover all the specific mounting locations, or alternatively, multiple different ACFs can be used, each ACF to selectively cover one or more of the specific mounting locations. ACF is configured such that in an uncompressed state, the conductive particles are physically separated from each other to prevent electrical conduction from one surface of the ACF to another. However, upon being sufficiently compressed in a specific direction, the conductive particles are pressed together in the direction of compression, thereby breaking through the conductive particle's insulating layer and forming a conductive link parallel to the direction of compression, for example the z-axis, but remaining non-conductive in the direction perpendicular to the direction of compression, for example the x-y plane. When compressed in the z-direction, the conductive particles are pressed together in the z-axis to form columns, each column electrically isolated from adjacent columns due to the original spacing of the particles in the non-compressed ACF. Spacing between adjacent electrically isolated columns can be 100 microns, or smaller. With the columns spaced so closely together, alignment of the ACF with the contact pads is ensured as one or more columns will be formed over a footprint of each contact pad to provide the desired electrical interconnect.

One surface of the ACF can be covered with a removable protective liner, such as a polyethylene terephthalate (PET) carrier or paper. The removable protective liner is subsequently removed to expose the surface of the ACF. In this manner the removable protective liner is similar in functionality to the removable backing on two-sided tape. The opposite surface of the ACF is exposed and is applied to the substrate 3D surface over the specific mounting location. In particular, the ACF covers the contact pads of the specific mounting location. The removable protective liner is facing upward away from the substrate.

In some embodiments, the adhesive quality of the ACF is sufficient to hold the ACF in place on the substrate 3D surface by simply placing the ACF on the substrate. In other embodiments, pressure and heat are applied to the ACF to more securely adhere the ACF to the substrate. Minimal pressure is applied at this step to prevent breaking of the conductive particle's insulating layer. The removable protective liner is then removed from the ACF.

The electronic component is then positioned on the ACF such that the electrical connection points on the electronic component are properly aligned with the electrical connection points of the specific mounting location. In some embodiments, the electronic component is a flip-chip semiconductor device, and the bumps on the flip-chip semiconductor device are the electrical connection points on the electronic component.

Heat and pressure are applied to the placed electronic component. The heat softens the film, while pressure forces the electronic component and substrate together, trapping some conductive particles between the corresponding electrical connection points of the electronic component and the substrate. The applied pressure at this step is sufficient to break the conductive particle's insulating layer to form conductive paths from the electrical connection points of the electronic component and the corresponding electrical connection points of the specific mounting location. Cooling the ACF locks the electrical connection points and trapped conductive particles in position, while non-trapped insulted conductive particles remain distributed, with no electrical contacts. The ACF is anisotropic in that electrical conduction is enabled in the z-axis, the direction of applied pressure, but limited laterally. The non-conducting portion of the ACF also functions as underfill adhesive, filling all of the space under the electronic component between the substrate.

FIG. 8 illustrates a cross-sectional view of an electronic device assembly according to some embodiments. The electronic device assembly 50 includes a 3D body that includes a 3D substrate 52 having a substrate 3D surface 54 and electrical connection points 56. The substrate 3D surface 54 includes a planar surface portion 53 and non-planar surface portion 55. The electrical connection points 56 are formed on the planar surface portion 53. The electrical connection points 56 form a specific mounting location for an electronic component 62. The electronic component 62 includes electrical connection points 64. Although two electrical connection points 56 and two electrical connection points 64 are shown in FIG. 8, it is understood that a specific mounting location can include more, or less, than two electrical connection points and that the electronic component can have more, or less, than two electrical connection points. In some embodiments, the number of electrical connection points 56 is equal to a number of electrical connection points 64. In some embodiments, each electrical connection point 56 is a contact pad, also referred to as a bond pad. The electrical component 62 is a discrete electrical component, such as a resistor, a capacitor, an inductor, a semiconductor chip or package, or the like. In some embodiments, the electronic component 62 is a flip-chip semiconductor device and the electrical connection points 64 are chip bumps. Although only electrical connection points 56 are shown in FIG. 8, it is understood that the 3D body can include additional conductive interconnects, such as conductive traces formed on the non-planar surface portion 55, coupled to the electrical connection points 56. In some embodiments, the 3D body is a 3D-MID body. In other embodiments, the 3D body is a 3D-IME body.

The electronic device assembly 50 also includes an ACF 58 and the electronic component 62. The ACF 58 includes conductive particles 60 suspended in an adhesive matrix. The ACF 58 is applied onto the substrate 3D surface 54 over the electrical connection points 56 of the specific mounting location. The electronic component 62 is aligned with the specific mounting location such that each electrical connection point 64 of the electronic component 62 is aligned with a corresponding electrical connection point 56 on the substrate 3D surface 54. The electronic component 62 is compressed toward the substrate 3D surface 54 such that conductive particles 60 are trapped between each electrical connection point 64 and the corresponding electrical connection point 56, so as to form an electrical pathway between aligned pairs of the electrical connection points 56 and 64 via the trapped conductive particles 60. It is understood that the sizes, thicknesses, and relative dimensions of the various elements shown in FIG. 8 are not to scale and are intended for illustrative purposes only.

Although a single specific mounting location and electronic component are shown in FIG. 8, the electronic device assembly can be configured with a 3D body having multiple specific mounting locations, and a corresponding different electronic component mounted at each specific mounting location in a manner similar to that described above.

The exemplary electronic device assembly 50 shown in FIG. 8 has the electronic component attached to a convex surface of the 3D substrate. Alternatively, the electronic device assembly can have the electronic component attached to a concave surface of the 3D substrate. FIG. 9 illustrates an electronic device assembly according to some other embodiments. The electronic device assembly 70 of FIG. 9 is similar to the electronic device assembly 50 of FIG. 8 except the electronic device assembly 70 has an electronic component 82 attached to a planar surface portion 73 of a substrate 3D surface 74 that is concave. In a similar manner as the electronic device assembly 50, the electronic device assembly 70 includes a 3D substrate 72 having the substrate 3D surface 74. The substrate 3D surface 74 includes the planar surface portion 73 and non-planar surface portion 75. The electronic device assembly 70 similarly includes electrical connection points 76, an ACF 78 having conductive particles 80, and the electronic component 82 having electrical connection points 84.

The exemplary electronic device assemblies 50 and 70 have 3D bodies that have regular non-planar surfaces, such as the domed configuration shown in FIGS. 8 and 9, with interspersed planar surface portions for mounting electronic components. It is understood that the electronic device assembly can include alternatively shaped 3D bodies including, but not limited to, substrates having a freeform non-planar surface 9, with interspersed planar surface portions for mounting electronic components.

Each planar surface portion described above, and as shown in FIGS. 8 and 9, have a footprint that substantially matches a footprint of the electronic component mounted to the planar surface portion. In alternative configurations, the entire surface underlying the electronic component need not be a planar surface, but instead only the surface portions of the substrate corresponding to each connection point are planar surfaces, and the surface portions between connection points can be non-planar surfaces.

Figure 10:
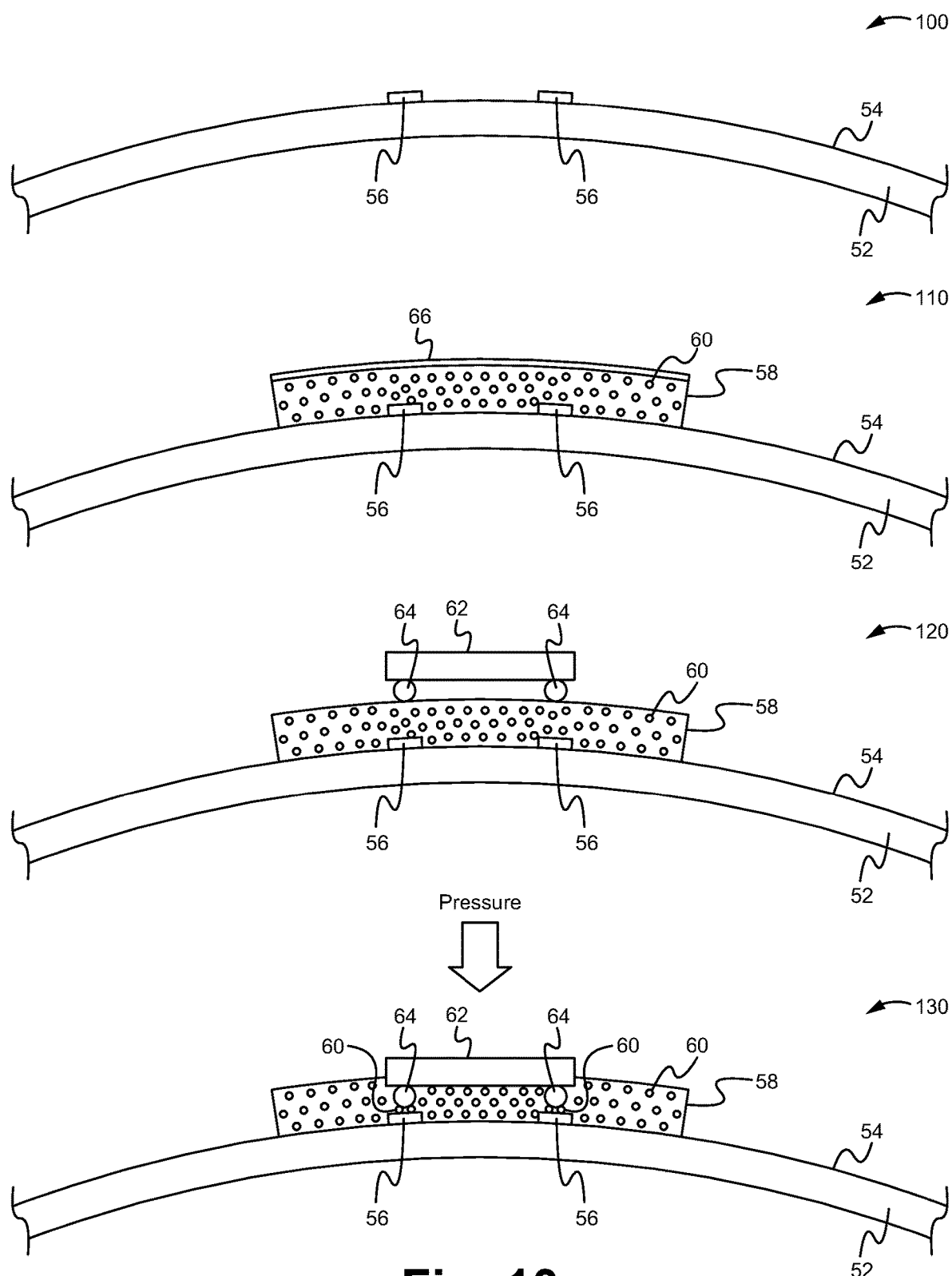
FIG. 10 illustrates an exemplary flow process of a method of manufacturing an electronic device assembly according to some embodiments.

FIG. 10 illustrates an exemplary flow process of a method of manufacturing an electronic device assembly according to some embodiments. The method shown in FIG. 10 is described in relation to the electronic device assembly 50 of FIG. 8. It is understood that the same methodology can be applied to fabricate similar electronic device assemblies or that similar methodologies can be used to fabricate the same or similar electronic device assembly as that shown in FIG. 8. At the step 100, the 3D body is formed. The 3D body includes the 3D substrate 52 having substrate 3D surface 54 with planar surface portion 53 and non-planar surface portion 55. The electrical connection points 56 are formed on the planar surface portion 53 of the substrate 3D surface 54. The electrical connection points 56 represent the specific mounting location. Other conductive interconnects (not shown) can be formed on the 3D body. It is understood that such conductive interconnects can include conductive traces and component contact pads. Conventional techniques for forming a 3D-MID body or a 3D-IME body can be used to form the 3D body.

At the step 110, ACF 58 is applied to the substrate 3D surface 54. The ACF 58 is positioned to cover the electrical connection points 56. The ACF 58 can include an optional removable protective liner 66. In some embodiments, the adhesive quality of the ACF 58 is sufficient to hold the ACF 58 in place on the substrate 3D surface 54 by simply placing the ACF 58 on the substrate 3D surface 54 within a minimum pressure to ensure adhesion. In other embodiments, pressure and heat are applied to the ACF 58 to more securely adhere the ACF 58 to the substrate 3D surface 54. Minimal pressure is applied to prevent breaking of the conductive particle's insulating layer at this step.

At the step 120, the removable protective liner 66, if present, is removed from the ACF 58. The electrical component 62 is then positioned on the ACF 58 and is aligned with the 3D substrate 52 such that each electrical connection point 64 of the electrical component 62 is aligned with a corresponding one of the electrical connection points 56 on the 3D substrate 52. In some embodiments, the electronic component 62 is positioned on the ACF 58 using a 3D pick and place process. The electrical component 62 is a discrete electrical component, such as a resistor, a capacitor, an inductor, a semiconductor chip or package, or the like. In some embodiments, the electrical component 62 is a flip-chip semiconductor device and the electrical connection points 64 are chip bumps.

At the step 130, heat and pressure are applied to the electronic component 62 and/or to the underside of the 3D substrate 52 to compress the electronic component 62 toward the substrate 3D surface 54. The amount of applied pressure is sufficient to trap select conductive particles 60 between the electronic connection points 56 and 64 and to break the outer insulting layer of the trapped conductive particles 60, thereby forming an electrical pathway between the electronic connection points 56 and 64 via the trapped conductive particles 60.

It is understood that the method steps can be rearranged or combined, or that additional method steps can be added to accomplish the same net results. In some embodiments, instead of first attaching the ACF to the 3D substrate, the ACF is first bonded to the electrical connection points of the electronic component to form an electronic component/ACF assembly. The ACF of this assembly is then attached to the 3D substrate.

An optional molding step can performed to encapsulate the electrical component 62. In some embodiments, only the top side of the electronic device assembly 50 is encapsulated. In other embodiments, the backside of the electronic device assembly 50 is also encapsulated. The overmold may serve to enhance the rigidity of the electronic device assembly 50 and/or add cosmetic features, as well as serve as encapsulation for protecting from the environment. Methods of molding can include, but are not limited to, low pressure molding (LPM), injection molding, compression molding, transfer molding, or similar encapsulation methods.

An advantage of using the ACF is that the electronic component can be immediately bonded in place on the 3D substrate surface without having to perform an additional curing step. Another advantage of ACF is that in fine pitch applications the short circuiting problem is eliminated.

The present application has been described in terms of specific embodiments incorporating details to facilitate the understanding of the principles of construction and operation of the electronic device assembly and method of manufacturing the electronic device assembly. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electronic device assembly comprising:
   a. a substrate having a 3D geometric classification, wherein the substrate comprises a substrate surface and one or more first electrical connection points on the substrate surface, wherein the substrate surface comprises a planar surface portion and a non-planar surface portion, and the one or more first electrical connection points are positioned on the planar surface portion;
   b. an adhesive film having a first surface and a second surface opposing the first surface, wherein the first surface of the adhesive film is coupled to the substrate surface and covers the one or more first electrical connections points; and
   c. an electronic component having one or more second electrical connection points, wherein the electronic component is pressed onto the second surface of the adhesive film and aligned with the planar surface portion of the substrate such that each of the one or more second electrical connection points of the electronic component is aligned with a corresponding one of the one or more first electrical connection points on the planar surface portion of the substrate surface.

2. The electronic device assembly of claim 1 wherein the substrate comprises a thermoplastic layer.

3. The electronic device assembly of claim 1 wherein each of the one or more first electrical connection points are contact pads.

4. The electronic device assembly of claim 1 wherein the electronic component is a flip-chip semiconductor device, and the one or more second electrical connection points are contact bumps.

5. The electronic device assembly of claim 1 wherein the substrate is a three-dimensional in-mold electronic (3D-IME) device.

6. The electronic device assembly of claim 1 wherein the substrate is a three-dimensional molded interconnect device (3D-MID).

7. The electronic device assembly of claim 1 wherein the adhesive film is an anisotropic conductive film or an anisotropic conductive paste.

8. The electronic device assembly of claim 7 wherein each of the one or more first electrical connection points is electrically connected to the corresponding one of the one or more first electrical connection points via the anisotropic conductive film or the anisotropic conductive paste.

9. The electronic device assembly of claim 1 wherein the substrate surface is a regular non-planar surface.

10. The electronic device assembly of claim 1 wherein the substrate surface is a freeform, non-planar surface.

11. A method of making an electronic device assembly, the method comprising:
    a. forming a substrate having a 3D geometric classification, wherein the substrate comprises a substrate surface and one or more first electrical connection points on the substrate surface, wherein the substrate surface comprises a planar surface portion and a non-planar surface portion, and the one or more first electrical connection points are positioned on the planar surface portion;
    b. applying an adhesive film to the substrate surface, wherein the adhesive film covers the one or more first electrical connections points;
    c. placing an electronic component onto the adhesive film, wherein the electronic component has one or more second electrical connection points, further wherein the electronic component is aligned with the planar surface portion of the substrate such that each of the one or more second electrical connection points of the electronic component is aligned with a corresponding one of the one or more first electrical connection points on the planar surface portion of the substrate surface; and
    d. applying heat and pressure to compress the electronic component and the substrate surface toward each other.

12. The method of claim 11 wherein placing the electronic component comprises using a three-dimensional pick and place process.

13. The method of claim 11 wherein forming the substrate comprises forming a three-dimensional body.

14. The method of claim 13 wherein the three-dimensional body is a three-dimensional in-mold electronic (3D-IME) device.

15. The method of claim 13 wherein the substrate is a three-dimensional molded interconnect device (3D-MID).

16. The method of claim 11 wherein the electronic component is a flip-chip semiconductor device, and the one or more electrical connection points are contact bumps, and placing the electronic component on the adhesive film comprises placing the contact bumps on the adhesive film.

17. The method of claim 11 wherein each of the one or more first electrical connection points are contact pads.

18. The method of claim 11 wherein forming the substrate having the substrate surface comprises forming the substrate surface as a regular non-planar surface.

19. The method of claim 11 wherein forming the substrate having the substrate surface comprises forming the substrate surface as a freeform, non-planar surface.

20. The method of claim 11 further comprising molding an overmold over the electronic component.

21. The method of claim 11 wherein the adhesive film is an anisotropic conductive film or an anisotropic conductive paste.

22. The method of claim 21 wherein applying heat and pressure to compress the electronic component and the substrate surface toward each other forms an electrical connection between each of the one or more second electrical connection points and corresponding one of the one or more first electrical connection points via the anisotropic conductive film or the anisotropic conductive paste.

23. The method of claim 11 further comprising applying heat to the adhesive film before placing the electronic component.

24. The electronic device assembly of claim 1 wherein the planar surface portion has a footprint that is equal to or less than a footprint of the electronic component.

25. The electronic device assembly of claim 1 wherein the first surface of the adhesive film is in direct contact with the substrate surface.

* * * * *